United States Patent
Kasko

(10) Patent No.: US 7,272,028 B2
(45) Date of Patent: Sep. 18, 2007

(54) MRAM CELL WITH SPLIT CONDUCTIVE LINES

(75) Inventor: Ihar Kasko, Mennecy (FR)

(73) Assignees: Infineon Technologies AG, Neubiberg (DE); Altis Semiconductor SNC, Corbeil Essonnes (FR)

( * ) Notice: Subject to any disclaimer, the term of this patent is extended or adjusted under 35 U.S.C. 154(b) by 26 days.

(21) Appl. No.: 11/138,643

(22) Filed: May 27, 2005

(65) Prior Publication Data
US 2006/0268600 A1 Nov. 30, 2006

(51) Int. Cl.
*G11C 5/08* (2006.01)

(52) U.S. Cl. .................... 365/66; 365/63; 365/51; 365/158; 365/173; 365/171; 365/130; 365/133

(58) Field of Classification Search .............. 365/148, 365/158, 173, 171, 130, 131, 133, 66, 63, 365/51
See application file for complete search history.

(56) References Cited

U.S. PATENT DOCUMENTS

| | | | |
|---|---|---|---|
| 6,104,632 A | 8/2000 | Nishimura | 365/158 |
| 6,879,516 B2* | 4/2005 | Nejad et al. | 365/171 |
| 6,882,553 B2* | 4/2005 | Nejad et al. | 365/63 |
| 6,950,333 B2 | 9/2005 | Hiramoto et al. | 356/158 |
| 7,023,743 B2* | 4/2006 | Nejad et al. | 365/189.08 |
| 7,061,115 B2* | 6/2006 | Drynan | 257/767 |
| 7,092,284 B2 | 8/2006 | Braun et al. | 365/158 |
| 7,212,432 B2 | 5/2007 | Ferrant et al. | 365/158 |
| 2004/0227172 A1 | 11/2004 | Park | 257/295 |
| 2006/0194442 A1* | 8/2006 | Baltzinger et al. | 438/745 |

FOREIGN PATENT DOCUMENTS

EP 1653516 A2 5/2006
EP 1677342 A1 * 7/2006

* cited by examiner

*Primary Examiner*—Andrew Q. Tran
(74) *Attorney, Agent, or Firm*—Edell, Shapiro & Finnan, LLC

(57) ABSTRACT

A magnetoresistive memory cell includes N magnetoresistive elements conductively connected in series (where N is an integer greater than or equal to two). The magnetoresistive elements, respectively, are positioned between at least two adjacent conductive lines. At least one of the conductive lines is a partially split conductive line having at least one slit portion encompassing an interconnect running therethrough and connected to at least one adjacent magnetoresistive element.

21 Claims, 2 Drawing Sheets

MRAM CELL WITH SPLIT CONDUCTIVE LINES

FIELD OF THE INVENTION

The present invention relates to non-volatile semiconductor memory chips, and more particularly, to magnetoresistive random access memory cells (MRAM cells) for use in a semiconductor integrated circuit.

BACKGROUND

In the semiconductor industy, strong efforts are made to bring a new promising memory technology based on non-volatile MRAM cells into practical use. An MRAM cell includes a stacked structure of magnetic layers separated by a non-magnetic tunneling barrier layer or conductive barrier. Using a non-magnetic tunneling barrier layer, a magnetoresistive tunnel junction (MTJ) memory cell is formed. Using a conductive barrier, a giantmagnetoresistive memory cell is formed. Here, and in agreement with conventional reading in the art, both alternatives are included by the term "magnetoresistive memory cell".

In MRAM cells, digital information is not maintained by power, as in conventional DRAMs, but rather by directions of magnetizations in the ferromagnetic layers. More specifically, in an MRAM cell, magnetization of one ferromagnetic layer ("reference layer" or "pinned layer") is magnetically fixed or pinned, while magnetization of the other ferromagnetic layer ("free layer") can be switched between two preferred directions along an easy axis of magnetization thereof, which typically is in parallel alignment with the reference layer fixed magnetization.

Depending upon the magnetic orientation of the free layer, an MRAM cell exhibits two different resistance values in response to a voltage applied across the MRAM cell, wherein the resistance thereof is "low" when magnetizations are in parallel alignment and "high" when magnetizations are in antiparallel alignment. Accordingly, logic values ("0" and "1") may be assigned to different magnetizations of the free layer and detection of electric resistance allows to provide the logic information stored in the magnetic memory element. An MRAM cell typically is written to by applying magnetic fields created by bi- or unidirectional currents made to run through conductive lines operatively located adjacent the MRAM cell so that magnetic fields thereof are coupled to the free layer magnetization.

In view of modern portable equipment, such as portable computers, digital still cameras, and the like, that require very large memory performance, one of the most important issues for memory devices is a further down-sizing thereof to allow an increased memory cell density. To this end, the stored number of bits per memory cell is increased by using a multibit memory cell architecture in which each memory cell includes a plurality (typically two) of series-connected magnetoresistive tunnel junctions (MTJs) per single access transistor. In such architecture, magnetoresistive tunnel junctions of one memory cell typically have different magnetoresistivities, i.e., different resistance values in response to a voltage applied across each magnetoresistive tunnel junction. Since a single access transistor is used for selecting plural magnetic memory elements and for a read operation thereof, integration density may be enhanced compared to other architectures comprising only one magnetoresistive tunnel junction per single access transistor. In above multibit memory cell architecture, in order to achieve a strong magnetic coupling of conductive lines to each of the MTJs, each MTJ typically is located in an intermediate position of adjacent conductive lines. Hence, in order to connect plural MTJs of a single memory cell and due to lateral dimensions of conductive lines, electric interconnects have to bypass conductive lines positioned in between MTJs to be connected, which by-passing, however, is detrimental in terms of achieving a high integration density of the memory device.

In light of the above, it is an object of the invention to provide a magnetoresistive memory cell allowing to improve integration density in memory devices particularly with regard to multibit memory cell architectures.

SUMMARY

In a first aspect of the invention, a magnetoresistive memory cell is given that includes N magnetoresistive (memory) elements conductively connected in series using interconnects, where N is an integer greater than or equal to two. Such series connection of magnetoresistive elements is, for instance, arranged in a vertically stacked relationship, and, typically, is conductively interposed between two conductive lines, or alternatively, a single conductive line and an access transistor for a reading operation thereof.

In such a memory cell, magnetoresistive elements are, for example, magnetoresistive tunneling junctions (MTJ), or alternatively, giant magnetoresistive junctions (GMJ), as appropriate. In case of MTJs, each MTJ typically includes a stacked structure including a ferromagnetic reference region (or layer) having fixed magnetization, a ferromagnetic free region (or layer) having free magnetization that can switch between oppositely aligned directions with respect to an axis thereof, and a tunneling barrier of non-magnetic material, where both ferromagnetic reference and free regions and the tunneling barrier together form a magnetoresistive tunneling junction. In case of GMJs, each GMJ typically includes a stacked structure including a ferromagnetic reference region (or layer) having fixed magnetization, a ferromagnetic free region (or layer) having free magnetization which can switch between oppositely aligned directions with respect to an axis thereof, and a conductive barrier of electrically conductive material, where both ferromagnetic reference and free regions and the conductive barrier together form a giant magnetoresistive junction. Such a memory cell includes two magnetoresistive tunnel junctions having different magnetoresistivities to allow storage of 4 bits in a single memory cell.

Further in such a memory cell, each of the magnetoresistive elements is operatively interposed between at least two, for example, only two, adjacent conductive lines, i.e., an upper conductive line and a lower conductive, in an intermediate position thereof for coupling of magnetic fields thereof to the magnetoresistive element respectively interposed therebetween. Upper and lower conductive lines typically run in different directions and are perpendicularly aligned to each other. Also, at least one of the upper and lower conductive lines typically is electrically isolated from the magnetoresistive element that is interposed therebetween. For instance, a topmost magnetoresistive element in a vertically stacked memory cell is conductively connected to an upper conductive line and may be electrically isolated from a lower conductive line, where both of upper and lower conductive lines are, for example, used for a writing operation thereof, while the upper conductive line is used for a reading operation thereof (in combination with another conductive line, or alternatively, an access transistor connected to a lowermost magnetoresistive element being series-connected with the topmost magnetoresistive element). However, both upper and lower conductive lines are electrically isolated from a magnetoresistive element interposed therebetween, which, for instance, in a vertically stacked memory cell, is for magnetoresistive elements arranged below a topmost magnetoresistive element.

According to the invention, at least one of the conductive lines is a partially split conductive line that includes at least one slit portion located substantially above and/or substantially below of adjacent magnetoresistive elements of a series connection thereof. The split portion is provided with a slit for encompassing an interconnect running therethrough connected to at least one of the adjacent magnetoresistive elements. Hence, interconnects conductively connect adjacent magnetoresistive elements to establish a series connection thereof, or alternatively, magnetoresistive elements with conductive lines or alternatively access transistors. The slit portion is, for example, filled with isolating material so that the interconnect running therethrough is electrically isolated from the slit portion. Further, magnetoresistive elements that are vertically stacked above interconnects that are, for example, substantially vertical, straight electric connections between structures, as described above, are formed, and are, for instance, "via-connections" as are known.

According to second aspect of the invention, a magnetoresistive memory cell includes a single magnetoresistive (memory) element, that typically is conductively interposed between two conductive lines, or alternatively, a single conductive line and an access transistor for a reading operation thereof. Such magnetoresistive elements are, for instance, embodied as magnetoresistive tunneling junctions (MTJ), or alternatively, giant magnetoresistive junctions (GMJ), as described above. In the memory cell, the magnetoresistive element is operatively interposed between at least two, for instance, only two, adjacent conductive lines, i.e., an upper conductive line and a lower conductive, in an intermediate position thereof for coupling of magnetic fields thereof to the magnetoresistive element interposed therebetween, where upper and lower conductive lines typically run in different directions and are perpendicularly aligned to each other. Typically, at least one of the upper and lower conductive lines is electrically isolated from the magnetoresistive element interposed therebetween. However, both upper and lower conductive lines are electrically isolated from the magnetoresistive element interposed therebetween.

According to the invention, at least one of the conductive lines is a partially split conductive line that includes at least one slit portion located substantially above and/or substantially below of the magnetoresistive element of the memory cell. The split portion is provided with a slit for encompassing an interconnect running therethrough connected to the adjacent magnetoresistive element, and is used to conductively connect the magnetoresistive element to a conductive line, or alternatively, an access transistor. The slit portion is, for example, filled with isolating material so that the interconnect running therethrough is electrically isolated from the slit portion. The interconnect, for instance, is substantially vertical so that a straight electric connection between structures, as above-described, is formed, and is, for instance, a via-connection.

Hence, a bypass connection between magnetoresistive elements bypassing a conductive line arranged between the magnetoresistive elements, a bypass connection between a magnetoresistive element and a conductive line, or an access transistor is avoided. Using slit conductive lines with slit portions having slits for encompassing an interconnect running therethrough enables straight electric connections between magnetoresistive elements, between a magnetoresistive element and a conductive line, or an access transistor by which integration density of memory cells is relatively increased.

According to third aspect of the invention, a memory device includes a plurality of planar magnetoresistive element arrays, where each planar magnetoresistive element array includes a plurality of magnetoresistive elements that are arranged in rows and columns. Further, a plurality of planar conductive line arrays has planar conductive line arrays in which each planar conductive line array includes a plurality of conductive lines in parallel alignment with each other. In such a memory device, each magnetoresistive element array is interposed between adjacent planar conductive line arrays such that each magnetoresistive element is arranged in between adjacent conductive lines. Further, each includes a plurality of memory cells, where each memory cell includes a series-connected plurality of magnetoresistive elements of a column and a row of the plurality of magnetoresistive element arrays.

According to such a memory device, at least one of the conductive lines is a partially split conductive line that includes at least one slit portion having a slit for encompassing an interconnect running therethrough. The latter is electrically connected to at least one adjacent magnetoresistive device, and is, for example, relatively substantially vertical. In such a memory device, the planar magnetoresistive device arrays and the planar conductive line arrays are arranged, for example, in a vertically stacked relationship. A horizontal arrangement thereof, however, is also possible. The memory device may further include a plurality of access transistors for a read operation of the memory cells, where each one of the memory cells is electrically connected to a single access transistor. Further, in above memory device, conductive lines of adjacent planar conductive line arrays extends, for example, in different directions having magnetoresistive memory elements at an intersection thereof.

In such a memory device, in the same conductive line array, a split portion of a conductive line is, for instance, located between two adjacing split portions of an adjacent conductive line. Such an arrangement allows conductive lines having a smaller inter-distance to enhance integration density of memory cells.

According to a firth aspect of the invention, a memory device includes a planar magnetoresistive element array. The plurality of magnetoresistive elements are arranged in rows and columns. Further, the memory device includes at least two planar conductive line arrays, where each planar conductive line array includes a plurality of conductive lines in parallel alignment with each other. In such a memory device, the magnetoresistive element array is interposed in between adjacent planar conductive line arrays, wherein each magnetoresistive element is arranged in between adjacent conductive lines. Further, the magnetoresistive element includes a plurality of memory cells, where each one includes a magnetoresistive element of a column and a row of the magnetoresistive element array.

At least one of the conductive lines is a partially split conductive line that includes at least one slit portion having a slit for encompassing an interconnect running therethrough. The latter is electrically connected to at least one adjacent magnetoresistive device, and is, for example, relatively substantially vertical. In such a memory device, the planar magnetoresistive device array and the planar conductive line arrays are arranged, for instance, in a vertically stacked relationship. A horizontal arrangement thereof, however, is also possible. The memory device may further include a plurality of access transistors for a read operation of the memory cells, where each one of the memory cells is electrically connected to a single access transistor. Further, in the above memory device, conductive lines of adjacent planar conductive line arrays extend in different directions having magnetoresistive memory elements at an intersection thereof.

A method of fabricating a memory device includes forming a plurality of planar magnetoresistive element arrays, forming a plurality of planar conductive line arrays, forming a plurality of memory cells, and forming at least one interconnect that runs through the at least one split portion and is electrically connected to at least one magnetoresistive element. Each planar magnetoresistive element array includes a plurality of magnetoresistive elements arranged in rows and columns. Each planar conductive line array includes a plurality of conductive lines arranged in parallel alignment with each other. Each magnetoresistive element array is interposed between adjacent planar conductive line arrays. Each magnetoresistive element is arranged between two adjacent conductive lines. Each memory cell includes a series-connected plurality of magnetoresistive elements of a column and a row of the plurality of magnetoresistive element arrays. At least one conductive line is formed to have at least one split portion.

In the above method, a split line is, for example, formed by etching a split trench in isolating material using conventional lithography steps and filling the trench with conductive material. Accordingly, the slit in the split portion is filled with isolating material.

At least one interconnect is formed in a self-aligned manner, for instance, using different etch selectivities of split portion materials, such as isolating material in the slit and conductive material in the surroundings thereof.

The method may further include forming a plurality of access transistors for a read operation of the memory cells. Each memory cell is electrically connected to a single access transistor.

In a sixth aspect of the invention, a method of fabricating a memory device includes forming a planar magnetoresistive element arrays, forming at least two planar conductive line arrays, forming a plurality of memory cells, and forming at least one interconnect running through the at least one split portion and is electrically connected to at least one magnetoresistive element. The planar magnetoresistive element arrays include a plurality of magnetoresistive elements arranged in rows and columns. Each planar conductive line array includes a plurality of conductive lines arranged in parallel alignment with each other. The magnetoresistive element array is interposed between adjacent planar conductive line array. Each magnetoresistive element is arranged in between two adjacent conductive lines. Each memory cell including a magnetoresistive element of a column and a row of the magnetoresistive element array. At least one conductive line is formed having at least one split portion.

At least one interconnect is formed in a self-aligned manner, for instance, using different etch selectivities of split portion materials, such as isolating material in the slit and conductive material in the surroundings thereof.

The method may further include forming a plurality of access transistors for a read operation of the memory cells. Each memory cell is electrically connected to a single access transistor.

Other and further objects, features and advantages of the invention will appear more fully from the following description.

The accompanying drawings, which are incorporated in and constitute a part of the specification, illustrate the present invention, and together with the general description given above and the detailed description given below, serve to explain the principles of the invention.

DETAILED DESCRIPTION

An embodiment of the present invention will be described in detail below with reference to the accompanying drawings, where like designations denote like or similar elements.

Figure 1:
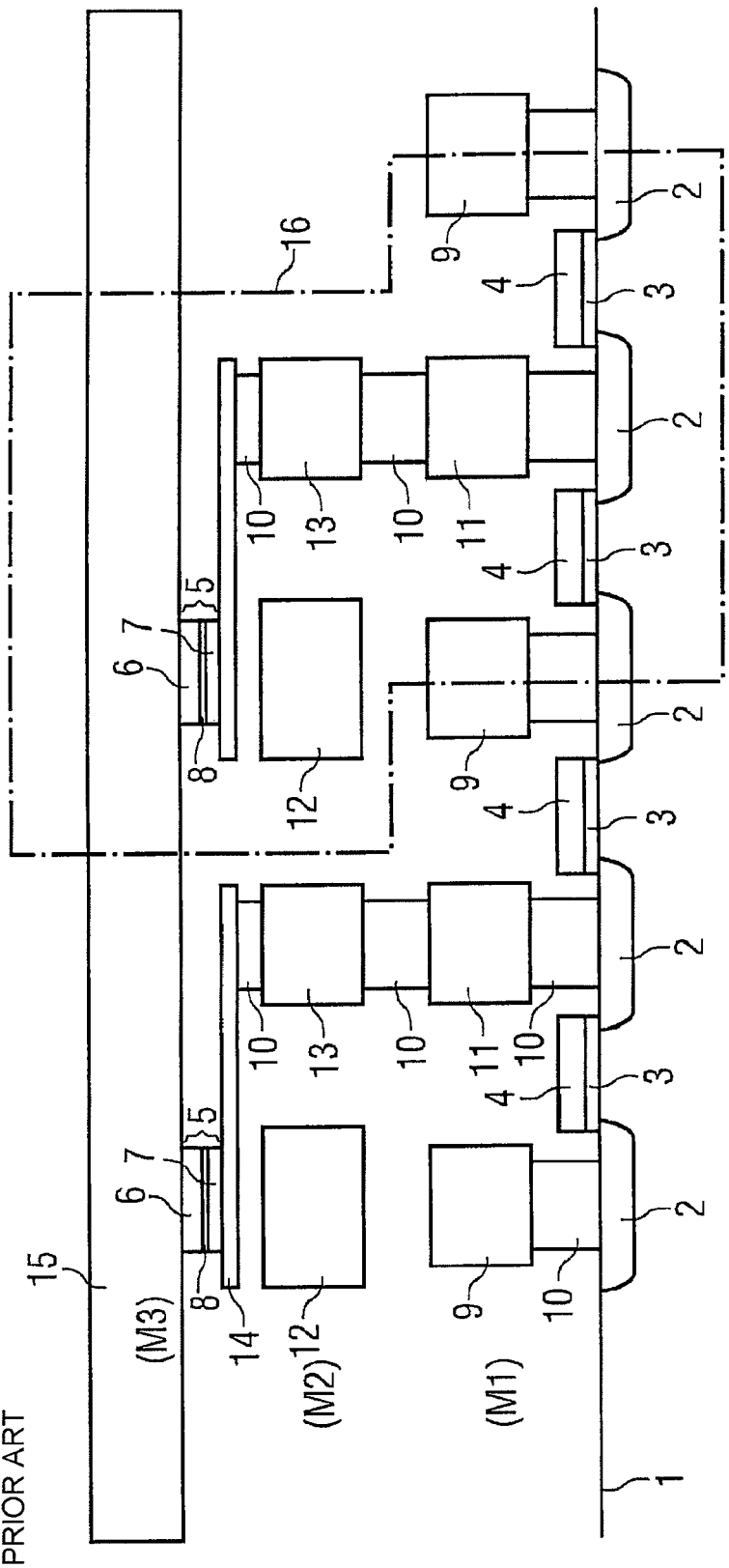
FIG. 1 depicts schematically a vertical sectional view of conventional MRAM cells.

Referring to FIG. 1, which schematic depicts a vertically sectioned view of conventional MRAM cells, in a planar surface 1 of a semiconductor substrate (wafer) plural active regions comprising source/drain regions 2 are formed. In between the source/drain regions 2, gate electrodes 4 are formed on dielectric material 3 that has been deposited on the semiconductor substrate surface 1. The gate electrodes 4 typically are formed or contacted from read word lines running in a direction perpendicular to the drawing plane. In a first metallization level (M1), plural conductive lines are formed in parallel alignment to each other running in a direction perpendicular to the drawing plane. Every second conductive line of M1 is a ground line 9 connected to ground, while conductive lines 11 interposed therebetween are not connected to ground. Ground lines 9 and non-grounded lines 11 are conductively connected to source-drain regions 2 by vertically extending interconnects 10 formed by conventional via-connections. In a second metallization level M2 above M1, plural conductive lines are formed in parallel alignment to each other running in a direction perpendicular to the drawing plane. Each second conductive line of M2 is a write word line 12, while conductive lines 13 not functioning as write word lines are interposed therebetween. Conductive lines 13 of M2 are electrically connected to non-grounded lines 11 of M1 by vertically extending interconnects 10 formed by conventional via-connections. Magnetoresistive tunnel junctions (MTJs) 5 are formed above M2. Each MTJ includes a layered stack of free layer 6, tunnel barrier 8, and reference layer 7. Each MTJ 5 is conductively connected to conductive lines 13 of M2 by laterally extending interconnect 14 and vertically extending interconnect 10. In a third metallization level M3 above second metallization level M2, plural conductive lines are formed in parallel alignment to each other running in a direction parallel to the drawing plane to function as bit lines 15. Bit lines 15 are in direct electric contact with MTJs 5.

The write word lines 12 of M2 and the bit lines 15 of M3 are arranged below or above MTJs 5, respectively, to sufficiently couple magnetic fields thereof to the free layer 6 magnetization. Accordingly, laterally extending interconnects 14 are required to conductively connect MTJs 5 to source/drain regions 2. In FIG. 1, an MRAM cell is marked using dotted line 16. While not explicitly specified in FIG. 1, the structures are embedded in isolating material.

Figure 2C:
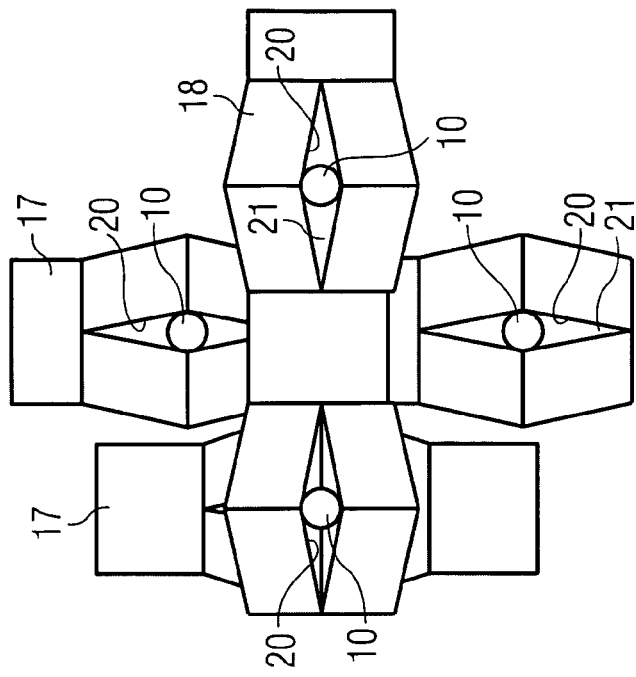
FIG. 2C schematically depicts a top-down view of an array of such MRAM cells.
Figure 2B:
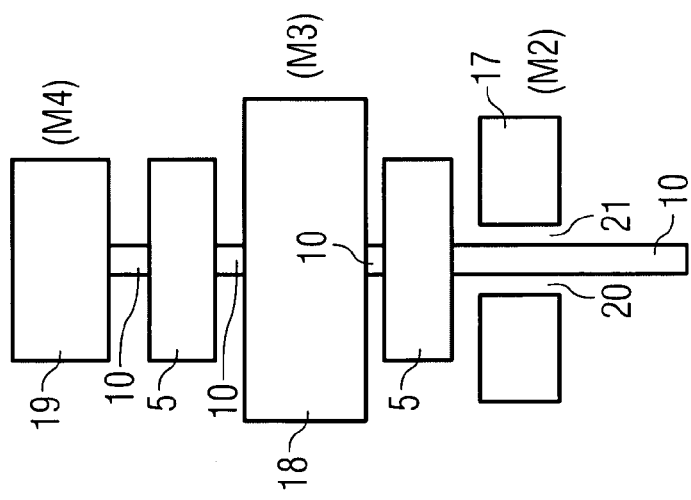
FIG. 2B schematically depicts a vertical sectional view of an embodiment of an MRAM cell according to the invention.
Figure 2A:
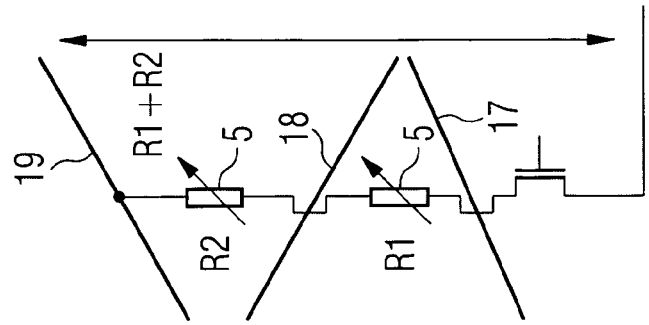
FIG. 2A schematically depicts a circuit diagram an MRAM cell according to the invention.

Now referring to FIGS. 2A, 2B and 2C, an embodiment of a memory cell including two magnetoresistive elements (MTJs) according to the invention and a top-down view onto an array of such memory cells is explained.

In FIG. 2A, a circuit diagram includes a series-connection of two MTJs 5 having different electric resistivities R1, R2 connected to an access transistor. Electric resistivity R1 is, for instance, 10/20 kOhm (in the parallel and anti-parallel case of free and reference magnetizations thereof), and electric resistivity R2, for instance, 20/40 kOhm (in the parallel and anti-parallel case of free and reference magnetizations thereof), resulting in total resistivities R=R1+R2 of 30, 40, 50 and 60 kOhm. FIG. 2A also depicts conductive lines 17, 18 crossing the series-connection of MTJs 5 without being in electric contact therewith.

Now referring to FIGS. 2B and 2C, a magnetoresistive memory cell according to the invention is illustrated including two MTJs 5 in a vertically stacked relationship connected in series by vertically extending interconnects 10. Each MTJ 5 includes a stacked structure including a ferromagnetic reference region having fixed magnetization, a ferromagnetic free region having free magnetization which can switch between oppositely aligned directions with respect to an easy axis thereof, and a tunneling barrier made of non-magnetic material, which are arranged to together form a magnetoresistive tunneling junction having different magnetoresistivities.

Each MTJ 5 is positioned in between two adjacent conductive lines, where conductive line 17 belongs to a second metallization (M2), conductive line 18 belongs to a third metallization (M3), and conductive line 19 belongs to a fourth metallization (M4). Conductive line 19 of M4 is electrically connected to the series connected MTJs 5 on one side of the series-connection thereof, while the other side of the series-connection thereof is electrically connected to another conductive line or an access transistor (not shown). Conductive lines 17, 18 of M2 and M3 are split conductive lines where each one includes a plurality of slit portions 20 encompassing interconnects 10 running vertically therethrough. Interconnects 10 provide a series-connection of MTJs 5, and also interconnection of the series-connection of MTJs 5 in between conductive line 19 and another conductive line or an access transistor (not shown). Interconnects 10 running through slit portions 20 are embedded in isolating material 21 so that electric connection of interconnections 10 and slit portions 20 are avoided. Conductive lines 17, 18, 19, respectively, belong to conductive line arrays having conductive lines arranged in parallel alignment with each other.

As can be taken from FIG. 2C, regarding conductive lines 17, a split portion 20 of a conductive line 17 is located between two adjacing split portions 20 of an adjacent conductive line 17. Likewise, regarding conductive lines 18, a split portion 20 of a conductive line 18 is located between two adjacing split portions 20 of an adjacent conductive line 18. By this measure, integration density of memory cells is enhanced.

In the present invention, integration density of MRAM cells is enhanced using split conductive lines having split portions encompassing interconnects, which allows use of existing memory cell concepts, such as MTJ FET scheme, adiabatic rotation memory cells, or vertical memory cells.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A magnetoresistive memory cell, comprising:
   N magnetoresistive elements conductively connected in series, where N is an integer greater than or equal to two, the magnetoresistive elements being positioned between at least two adjacent conductive lines, wherein at least one of the conductive lines is a partially split conductive line, the partially split conductive line including at least one slit portion encompassing an interconnect running therethrough and being connected to at least one adjacent magnetoresistive element.

2. The memory cell of claim 1, wherein at least one of the at least two conductive lines adjacent a magnetoresistive element is electrically isolated from the magnetoresistive element.

3. The memory cell of claim 1, wherein the magnetoresistive elements are vertically stacked.

4. The memory cell of claim 1, wherein the interconnect is substantially vertical.

5. The memory cell of claim 1, wherein each one of the magnetoresistive elements comprises:
   a stacked structure including a ferromagnetic reference region having fixed magnetization,
   a ferromagnetic free region having free magnetization that switches between oppositely aligned directions with respect to an axis thereof, and
   a tunneling barrier made of non-magnetic material, the ferromagnetic reference region, the free region, and the tunneling barrier forming a magnetoresistive tunneling junction.

6. The memory cell of claim 5, further comprising:
   two magnetoresistive tunnel junctions having different magnetoresistivities.

7. A memory device, comprising:
   a plurality of planar magnetoresistive element arrays, each planar magnetoresistive element array including a plurality of magnetoresistive elements arranged in rows and columns;
   a plurality of planar conductive line arrays, each planar conductive line array including a plurality of conductive lines being in parallel alignment with each other, where each magnetoresistive element array is interposed in between adjacent planar conductive line arrays such that each magnetoresistive element is arranged in between adjacent conductive lines; and
   a plurality of memory cells, each memory cell including a series-connected plurality of magnetoresistive elements of a column and a row of the plurality of magnetoresistive element arrays,
   wherein at least one of the conductive lines is a partially split conductive line including at least one slit portion encompassing an interconnect running therethrough and being electrically connected to at least one adjacent magnetoresistive element.

8. The memory device of claim 7, wherein the planar magnetoresistive element arrays and the planar conductive line arrays are vertically stacked.

9. The memory device of claim 8, wherein the interconnects are substantially vertical.

10. The memory device of claim 7, further comprising:
a plurality of access transistors for a read operation of the memory cells, wherein each memory cell is electrically connected to a single access transistor.

11. The memory device of claim 7, wherein conductive lines of adjacent planar conductive line arrays extend in different directions.

12. The memory device of claim 11, wherein the magnetoresistive memory elements are located at cross-points of the conductive lines.

13. The memory device of claim 7, wherein, in a same conductive line array, a split portion of a conductive line is disposed between two adjacing split portions of an adjacent conductive line.

14. The memory device of claim 7, wherein each magnetoresistive element comprises:
a stacked structure including a ferromagnetic reference region having fixed magnetization,
a ferromagnetic free region having free magnetization that switches between oppositely aligned directions with respect to an axis thereof, and
a tunneling barrier of non-magnetic material,
the ferromagnetic reference region, the free region, and the tunneling barrier forming a magnetoresistive tunneling junction.

15. A memory device, comprising:
a planar magnetoresistive element array including a plurality of magnetoresistive elements arranged in rows and columns;
at least two planar conductive line arrays, each planar conductive line array including a plurality of conductive lines in parallel alignment with each other; and
a plurality of memory cells, each memory cell including a magnetoresistive element of a column and a row of the magnetoresistive element array,
wherein the magnetoresistive element array is interposed between adjacent planar conductive line arrays such that each magnetoresistive element is arranged between adjacent conductive lines, and at least one of the conductive lines is a partially split conductive line including at least one slit portion encompassing an interconnect running therethrough and being electrically connected to at least one adjacent magnetoresistive element, and in a same conductive line array, a split portion of a conductive line is disposed between two adjacent split portions of an adjacent conductive line.

16. The memory device of claim 15, wherein the planar magnetoresistive element arrays and the planar conductive line arrays are vertically stacked.

17. The memory device of claim 15, wherein the interconnects are substantially vertical.

18. The memory device of claim 15, further comprising:
a plurality of access transistors for a read operation of the memory cells, wherein each memory cell is electrically connected to a single access transistor.

19. The memory device of claim 15, wherein conductive lines of the adjacent planar conductive line arrays extend in different directions.

20. The memory device of claim 15, wherein the magnetoresistive memory elements are located at cross-points of the conductive lines.

21. The memory device of claim 15, wherein each magnetoresistive element comprises:
a stacked structure including a ferromagnetic reference region having fixed magnetization,
a ferromagnetic free region having free magnetization that switches between oppositely aligned directions with respect to an axis thereof, and
a tunneling barrier of non-magnetic material,
the ferromagnetic reference region, the free region, and the tunneling barrier forming a magnetoresistive tunneling junction.

* * * * *